(12) United States Patent
Qiao et al.

(10) Patent No.: US 9,950,505 B2
(45) Date of Patent: Apr. 24, 2018

(54) METHOD FOR MANUFACTURING FLEXIBLE DISPLAY DEVICE

(71) Applicant: BOE TECHNOLOGY GROUP CO., LTD., Beijing (CN)

(72) Inventors: Yong Qiao, Beijing (CN); Hongli Wang, Beijing (CN); Yanli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 186 days.

(21) Appl. No.: 14/124,397

(22) PCT Filed: Dec. 21, 2012

(86) PCT No.: PCT/CN2012/087184
§ 371 (c)(1),
(2) Date: Dec. 6, 2013

(87) PCT Pub. No.: WO2014/012338
PCT Pub. Date: Jan. 23, 2014

(65) Prior Publication Data
US 2015/0075705 A1 Mar. 19, 2015

(30) Foreign Application Priority Data

Jul. 16, 2012 (CN) .......................... 2012 1 0246028

(51) Int. Cl.
*B32B 38/10* (2006.01)
*H01L 51/00* (2006.01)
(Continued)

(52) U.S. Cl.
CPC .............. *B32B 38/10* (2013.01); *B32B 37/18* (2013.01); *B32B 37/24* (2013.01);
(Continued)

(58) Field of Classification Search
CPC ............. H01L 51/0097; H01L 51/5246; B32B 2315/08; B32B 2457/20; B32B 2457/202;
(Continued)

(56) References Cited

U.S. PATENT DOCUMENTS

2005/0245165 A1 11/2005 Harada et al.
2008/0110862 A1 5/2008 Kim et al.
(Continued)

FOREIGN PATENT DOCUMENTS

CN 1694589 A 11/2005
CN 101038857 A 9/2007
(Continued)

OTHER PUBLICATIONS

English translation of Chinese Patent No. 101038857, 43pgs.
(Continued)

*Primary Examiner* — Jeffry H Aftergut
(74) *Attorney, Agent, or Firm* — Ladas & Parry LLP

(57) ABSTRACT

A method for manufacturing the display device (70, 80) comprises: providing a first flexible substrate (101) comprising a first and second surfaces and a second flexible substrate (102) comprising a third and fourth surfaces; joining the second surface of the first flexible substrate with the third surface of the second flexible substrate by a connecting element (11) to form a laminated structure, wherein the first surface of the first flexible substrate (101) is a first outer surface of the laminated structure, and the fourth surface of the second flexible substrate (102) is a second outer surface of the laminated structure; forming a first flexible display element layer (10a) and a second flexible display element layer (10b) respectively on the first and second outer surfaces of the laminated structure; separating the first flexible substrate (101) from the second flexible substrate (102) of the laminated structure. The
(Continued)

manufacturing method can achieve simultaneous processing of two substrates during part of the manufacturing technology, thus improving the production efficiency and reducing the production costs.

24 Claims, 10 Drawing Sheets

(51) Int. Cl.
*H01L 51/52* (2006.01)
*B32B 37/18* (2006.01)
*B32B 37/24* (2006.01)
*B32B 38/00* (2006.01)
*B32B 37/12* (2006.01)

(52) U.S. Cl.
CPC ...... *B32B 38/0008* (2013.01); *H01L 51/0097* (2013.01); *H01L 51/5246* (2013.01); *B32B 37/12* (2013.01); *B32B 2037/243* (2013.01); *B32B 2315/08* (2013.01); *B32B 2457/20* (2013.01); *B32B 2457/202* (2013.01); *B32B 2457/204* (2013.01); *B32B 2457/206* (2013.01); *Y02E 10/549* (2013.01); *Y02P 70/521* (2015.11)

(58) Field of Classification Search
CPC ........ B32B 2457/204; B32B 2457/206; B32B 37/12; B32B 37/18; B32B 38/10
USPC ........................................................ 156/247
See application file for complete search history.

(56) References Cited

U.S. PATENT DOCUMENTS

| | | |
|---|---|---|
| 2009/0115942 A1 | 5/2009 | Wantanbe |
| 2010/0210055 A1 | 8/2010 | Yoon et al. |
| 2010/0279576 A1 | 11/2010 | Kim |
| 2012/0182598 A1 | 7/2012 | Morisue et al. |

FOREIGN PATENT DOCUMENTS

| | | |
|---|---|---|
| CN | 101202329 A | 6/2008 |
| CN | 101297340 A | 10/2008 |
| CN | 102810512 A | 12/2012 |
| EP | 1933401 A1 | 6/2008 |

OTHER PUBLICATIONS

English translation of Chinese Patent No. CN101877319, 17pgs.
English translation of Chinese Patent No. CN102810512, 38pgs.
English translation of Chinese Patent No. CN101202329, 29pgs.
English translation of Chinese Patent No. CN101297340, 34pgs.
First Chinese Office Action issued by the Chinese Patent Office for Chinese Patent Application No. 201210246028.4, 5pgs.
English translation of First Chinese Office Action issued by the Chinese Patent Office for Chinese Patent Application No. 201210246028.4, 3pgs.
International Search Report for International Application No. PCT/CN2012/087184, 12pgs.
English translation of Chinese Patent No. CN1694589, 12pgs.
International Preliminary Report on Patentability for International Application No. PCT/CN2012/087184, Eleven (11) pages.
Extended European Search Report Appln. No. 12878649.8-1706 / 2894689 PCT/CN2012087184; dated Mar. 23, 2016.

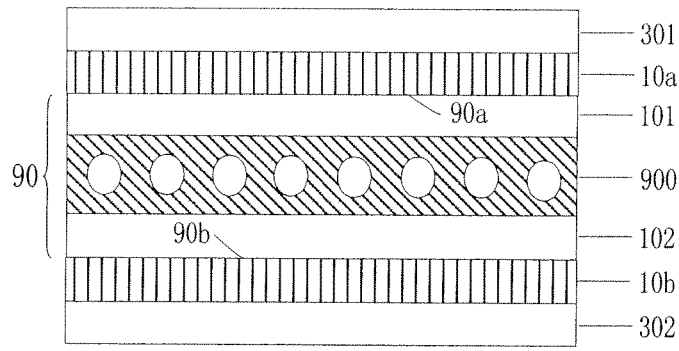

FIG.7f providing a first display device comprising a first substrate, a first flexible display element layer and a first opposite flexible substrate and a second display device comprising a second substrate, a second flexible display element layer and a second opposite flexible substrate

↓ joining an outer surface of the first opposite flexible substrate of the first display device to an outer surface of the second opposite flexible substrate of the second display device by a connecting element, forming a laminated structure

↓ thinning the first and second outer surfaces of the laminated structure

↓ separating the first and second display devices

FIG.8

METHOD FOR MANUFACTURING FLEXIBLE DISPLAY DEVICE

TECHNICAL FIELD

Embodiments of present invention relate to a method for manufacturing a flexible display device.

BACKGROUND

In recent years, the display market is in an increasingly development, especially in the flat display field, such as liquid crystal display (LCD), plasma display (PDP), organic light-emitting display (OLED), etc, which have achieved more and more extensive applications due to their capability of being manufactured to be large-dimensional, thin and light weight display devices.

The existing liquid crystal displays, plasma displays, organic light emitting display, however, mainly use glass substrates, and since a glass substrate is subjected to its disadvantages, such as friability, vulnerableness etc, it's applications in the fields of mobile display devices requiring portable, compact and light and the large sized display devices are limited. Therefore, in these days, it has attracted broad attention to manufacture the flexible display devices using a flexible substrate, such as plastic substrate, metal foil, etc., instead of glass substrate, and flexible display devices would also have broader growth space in the future display techniques.

While flexible substrates process a series of advantages, they have deficiencies as well, that is, due to their flexibility and thermal expansion, it's inconvenient to process the display devices; the substrates are easy to sag and even corrugation or abruption occurs, making it difficult to accurately perform fabrication processes of the subsequent films. In order to overcome such problems, it's necessary for the flexible substrate to be adhered onto a rigid substrate, such as a glass substrate, to support and secure the flexible substrate so as to facilitate formation of the films and subsequently removing the support substrate. In this way, it's possible to make flexible display devices utilizing existing process equipments for glass substrates, thus achieving the purpose of simplifying technology and saving costs. However, this process also undoubtedly increases the process complexity and manufacturing costs, and substrates are easy to be damaged in the process of adhering and separating the flexible substrates, thus affecting product performance.

SUMMARY

The embodiments of present invention provides a method for manufacturing flexible display device, and with this method, two pieces of flexible display devices can be processed simultaneously during part of manufacturing processes, thereby greatly improving production capacity, saving manufacturing costs and further improving product yield and production efficiency.

One aspect of the present invention discloses a method for manufacturing a flexible display device. The method for manufacturing flexible display device comprises: providing a first flexible substrate comprising a first surface and a second surface and a second flexible substrate comprising a third surface and a fourth surface; joining the second surface of the first flexible substrate with the third surface of the second flexible substrate by a connecting element to form a laminated structure, wherein the first surface of the first flexible substrate is a first outer surface of the laminated structure, and the fourth surface of the second flexible substrate is a second outer surface of the laminated structure; forming a first flexible display element layer and a second flexible display element layer respectively on the first and second outer surfaces of the laminated structure; and separating the first flexible substrate from the second flexible substrate of the laminated structure.

Furthermore, the method for manufacturing the flexible display device, for example, may further comprises forming the first and second opposite flexible substrates respectively on the first and second flexible display element layers, after the first and second outer surfaces of the laminated structure are formed with the first and second flexible display element layers thereon, respectively.

Furthermore, the method for manufacturing the flexible display device, for example, may further comprise: providing a support member comprising first and second surfaces opposite to each other; joining the second surface of the first flexible substrate with the third surface of the second flexible substrate by a connecting element to form a laminated structure may be that the second surface of the first flexible substrate and the third surface of the second flexible substrate are fixed to the first and second surfaces of the support member by the connecting element, respectively, so as to from the laminated structure.

Furthermore, for example, fixing of the second surface of the first flexible substrate and the third surface of the second flexible substrate respectively to the first and second surfaces of the support member by a connecting element may comprise: bonding the second surface of the first flexible substrate and the third surface of the second flexible substrate to the first and second surfaces of the support member through an adhesive layer.

Furthermore, for example, fixing of the second surface of the first flexible substrate and the third surface of the second flexible substrate respectively to the first and second surfaces of the support member by the connecting element may comprise: bonding the peripheral areas of the first and second flexible substrates with the peripheral areas of the first surface and the second surface of the support member through an adhesive layer.

Furthermore, for example, fixing of the second surface of the first flexible substrate and the third surface of the second flexible substrate respectively to the first and second surfaces of the support member by the connecting element may further comprise: providing spacers for supporting flexible substrates at the central areas of the first surface and the second surface of the support member, respectively, so as to separate the first and second flexible substrates from the support member.

Furthermore, for example, the first and second flexible substrates may be glass substrates; joining of the second surface of the first flexible substrate to the third surface of the second flexible substrate by the connecting element may comprise: bonding the second surface of the first flexible substrate and the third surface of the second flexible substrate through an adhesive layer.

Furthermore, for example, the first and second flexible substrates are glass substrates; joining of the second surface of the first flexible substrate to the third surface of the second flexible substrate by the connecting element may comprise: bonding the peripheral area of the second surface of the first flexible substrate and the peripheral area of the third surface of the second flexible substrate through an adhesive layer.

Furthermore, for example, joining of the second surface of the first flexible substrate to the third surface of the second flexible substrate by a connecting element may further comprise: providing spacers at central areas of the second surface of the first flexible substrate and the third surface of the second flexible substrate, to separate the first and second flexible substrates from each other.

Furthermore, for example, the spacers are removable.

Furthermore, for example, separating of the first flexible substrate from the second flexible substrate of the laminated structure may comprise: dissolving the adhesive layer with solvent, and separating the first flexible substrate from the second flexible substrate of the laminated structure.

Furthermore, for example, the adhesive layer may contain silicane-based adhesive, and the solvent may be a tetrahydrofuran solution.

Furthermore, for example, the laminated structure may be transparent; separating of the first flexible substrate from the second flexible substrate of the laminated structure may comprise: irradiating the adhesive layer from the upper and lower surfaces of the laminated structure with a laser to separate the first flexible substrate from the second flexible substrate of the laminated structure.

Furthermore, for example, the adhesive layer may contain polyimide.

Furthermore, for example, separating of the first flexible substrate from the second flexible substrate of the laminated structure may comprise: irradiating the adhesive layer from the sides of the laminated structure with a laser to separate the first flexible substrate from the second flexible substrate of the laminated structure.

Furthermore, for example, the adhesive layer may contain polyimide.

Furthermore, for example, before joining the second surface of the first flexible substrate to the third surface of the second flexible substrate by the connecting element, may further comprise: forming buffer layers on the second surface of the first flexible substrate and the third surface of the second flexible substrate.

Furthermore, for example, the buffer layers may be SiN:H or a-Si:H layers.

Furthermore, for example, the laminated structure may be transparent; separating of the first flexible substrate from the second flexible substrate of the laminated structure may comprise: irradiating the buffer layers from the upper and lower surfaces of the laminated structure with a laser to separate the first flexible substrate from the second flexible substrate of the laminated structure.

Furthermore, for example, separating of the first flexible substrate from the second flexible substrate of the laminated structure may comprise: providing cutting lines inside of the adhesive layer, and cutting along the cutting lines to separate the first flexible substrate from the second flexible substrate of the laminated structure.

Furthermore, for example, joining of the second surface of the first flexible substrate to the third surface of the second flexible substrate by a connecting element may comprise: providing a vacuum adsorbable substrate comprising first and second surfaces that are opposite to each other, performing evacuating process upon the vacuum adsorbable substrate such that the first and second flexible substrates are adsorbed to the first and second surfaces of the vacuum adsorbable substrate, respectively. Separating of the first flexible substrate from the second flexible substrate of the laminated structure may comprise: releasing the vacuum inside the vacuum adsorbable substrate so as to disengage both the first flexible substrate and the second flexible substrate from the vacuum adsorbable substrate.

Furthermore, for example, the vacuum adsorbable substrate may also have four sides adjoining with its first and second surfaces, and further, an interior of the vacuum adsorbable substrate have passages communicating with each other; there are openings running into inner passages distributed at the first and second surfaces and at least one side of the vacuum adsorbable substrate, wherein the opening at the at least one side is used for connecting the vacuum pumping equipment.

Furthermore, for example, joining of the second surface of the first flexible substrate to the third surface of the second flexible substrate by a connecting element may comprise: providing fasteners at peripheral areas of the first and second flexible substrates so as to join the first and second flexible substrates into a laminated structure.

Furthermore, for example, fixing of the second surface of the first flexible substrate to the third surface of the second flexible substrate to the first and second surfaces of the support member by a connecting element may comprise: providing fasteners at peripheral areas of the first and second flexible substrates so as to join the first and second flexible substrates to the support member to form a laminated structure.

Furthermore, for example, the flexible display element layer may be any one of the organic light emitting layer, the liquid crystal display layer, the electrophonic display layer, the electrowetting layer and the electrochromism layer.

Another aspect of the present invention also provides a method for manufacturing a flexible display device may comprising: providing a first display device comprising a first substrate, a first flexible display element layer and a first opposite flexible substrate; providing a second display device comprising a second substrate, a second flexible display element layer and a second opposite flexible substrate; joining an outer surface of the first opposite flexible substrate of the first display device to an outer surface of the second opposite flexible substrate of the second display device by a connecting element to form a laminated structure; thinning the first, second outer surfaces of the laminated structure; and separating the first and second display devices from each other.

Furthermore, for example, joining of the outer surface of the first opposite flexible substrate of the first display device to the outer surface of the second opposite flexible substrate of the second display device by a connecting element may comprise: bonding the outer surface of the first opposite flexible substrate of the first display device and the outer surface of the second opposite flexible substrate of the second display device through an adhesive layer.

Furthermore, for example, joining of the outer surface of the first opposite flexible substrate of the first display device to the outer surface of the second opposite flexible substrate of the second display device by a connecting element may comprise: bonding the peripheral area of the outer surface of the first opposite flexible substrate of the first display device and the peripheral area of the outer surface of the second opposite flexible substrate of the second display device through an adhesive layer.

Furthermore, for example, joining of the first opposite flexible substrate of the first display device to the second opposite flexible substrate of the second display device by a connecting element may further comprise: providing spacers at central areas of the first and second opposite flexible substrates to separate the first and second display devices from each other.

Furthermore, for example, the spacers may be removable.

Furthermore, for example, the laminated structure may be transparent; the separation of the first and second display devices from each other may comprise: irradiating the adhesive layer from the upper and lower surfaces of the laminated structure with a laser to separate the first and second display devices.

Furthermore, for example, separating of the first and second display devices from each other may comprise: irradiating the adhesive layer from the sides of the laminated structure with a laser to separate the first and second display devices.

Furthermore, for example, the adhesive layer may contain polyimide.

Furthermore, for example, before joining the first opposite flexible substrate of the first display device to the second opposite flexible substrate of the second display device by the connecting element so as to form a laminated structure, may further comprise: forming buffer layers on the first opposite flexible substrate and the second opposite flexible substrate.

Furthermore, for example, the buffer layers may be SiN:H or a-Si:H layers.

Furthermore, for example, the laminated structure may be transparent; separating of the first and second display devices from each other may comprise: irradiating the buffer layers from the upper and lower surfaces of the laminated structure with a laser to separate the first and second display devices.

Furthermore, for example, separating of the first and second display devices from each other may comprise: providing cutting lines inside of the adhesive layer formed at the peripheral areas of the first and second opposite flexible substrates, and cutting along the cutting lines to separate the first and second display devices from each other.

Furthermore, for example, the flexible display element layer may be any one of the organic light emitting layer, the liquid crystal display layer, the electrophonic display layer, the electrowetting layer and the electrochromism layer.

Yet another aspect of the present invention also provides a flexible display device comprising the flexible display device employing any one of the above manufacturing methods.

BRIEF DESCRIPTION OF THE DRAWINGS

In order to illustrate the technical solution of the embodiment of present invention more clearly, a simply introduction about the drawings of the embodiments will be made in the following, and obviously, the drawings described later relate to only some embodiments of the present invention, rather than limitation to the present invention.

FIGS. 7a-7f a the eighth embodiment of the method for manufacturing a flexible display device; and FIG. 8 is a ninth embodiment of the method for manufacturing a flexible display device.

DETAILED DESCRIPTION

To make clearer the object, technical solutions and advantages of the embodiments of present invention, a clear and full description of the technical solution of the embodiment of present invention will be made with reference to the accompanying drawings of the embodiment of present invention. Obviously, the described embodiments are merely part of the embodiments of the present invention, but not all the embodiments. Based on the described embodiments of present invention, all the other embodiments acquired by the ordinary skilled in this art, without any creative labor, fall into the protective scope of the present invention.

Unless defined otherwise, the technical terms or scientific terminology being used should take the meaning usually understood by the ordinary skilled in this art of present invention. The words "first", "second" or the similar words used in the patent application specification and claims of the present invention do not mean any sequence, quantity or importance, but are only used to distinguish different components. Also, "a", "an", "the" or the like does not mean quantitative restriction, but refers to the existence of at least one. The words "comprise" or "contain" and similar words intend to mean that the elements or articles before the words encompass the elements or articles and the equivalent thereof listed after the words, and do not exclude other elements or articles. The word "connecting" or "coupling" and the like is not limited to physical or mechanical connection, but may comprise electrical connection regardless of being direct or indirect. Further, the phrases "on", "below", "left", "right" etc are used only for describing a relative positional relationship, which will be varied correspondingly when the described objects are changed in its absolute position.

An embodiment of present invention provides a method for manufacturing a flexible display device, which can manufacture flexible display devices utilizing existing equipments and processing two flexible display devices simultaneously during part of the manufacturing processes.

Embodiment 1

Figure 1A:
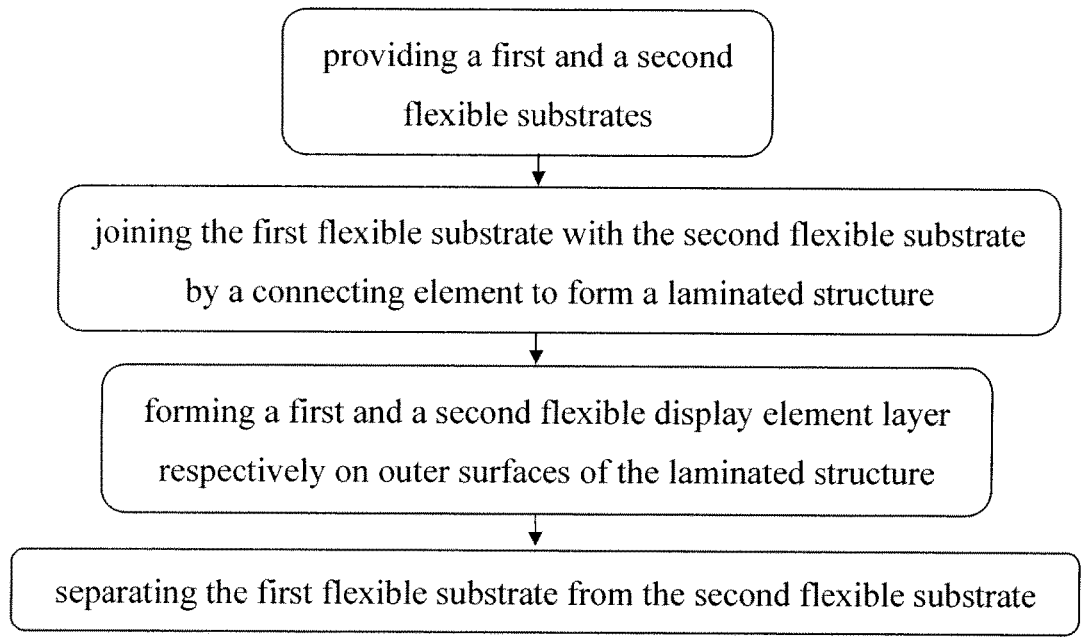
FIG. 1 is a first embodiment of the method for manufacturing a flexible display device.

Referring to FIG. 1, the method for manufacturing a flexible display device provided by this embodiment comprises the following steps.

1. Providing a first flexible substrate comprising a first surface and a second surface, and providing a second flexible substrate comprising a third surface and a fourth surface.

2. Joining the second surface of the first flexible substrate to the third surface of the second flexible substrate by a connecting element to form a laminated structure, wherein the first surface of the first flexible substrate and the second surface of the second flexible substrate work as the first, second outer surfaces of the laminated structure, respectively.

In step 2, the connecting element may be any one of an adhesive layer, a vacuum adsorbable substrate, a fastener or other connection manor.

3. Forming a first flexible display element layer and a second flexible display element layer on the first, second outer surfaces of the laminated structure, respectively.

The above step 3 further comprises: forming a first opposite flexible substrate and a second opposite flexible substrate on the first and second flexible display element layers, respectively, after the first and second outer surfaces of the laminated structure are formed with the first and second flexible display element layers thereon, respectively.

In step 3, the flexible display element layer may be any one of an organic light emitting layer, a liquid crystal display layer, an electrophonic display layer, an electrowetting layer, an electroluminescent layer and so on.

4. Separating the first flexible substrate from the second flexible substrate of the laminated structure.

In step 4, for different connecting elements, the corresponding separating operation may be any one of dissolution separating, laser separation, vacuum release, fastener removal, and so on.

The method for manufacturing a flexible display device in this embodiment can manufacture a flexible display device utilizing existing equipments, and can processing two display devices at the same time, thus simplifying processes and achieving the purpose of improving production efficiency and cost-cutting.

Embodiment 2

Referring to FIGS. 2a-2d, the method for manufacturing the flexible display device comprises the following steps.

1. Providing a first flexible substrate 101 comprising a first surface and a second surface, and providing a second flexible substrate 102 comprising a third surface and a fourth surface. The second surface 101b of the first flexible substrate 101 and the first surface 102a of the second flexible substrate 102 each comprise a protective layer (not shown).

Figure 2A:
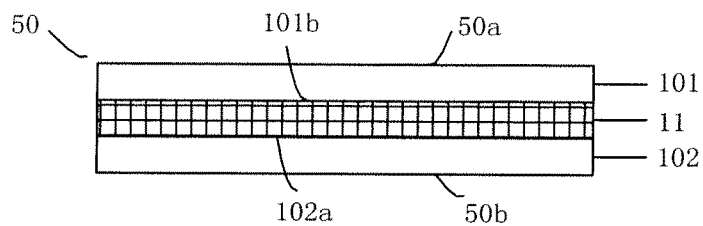
FIGS. 2a-2d a the second embodiment of the method for manufacturing a flexible display device.

2. As shown in FIG. 2a, providing the second surface 101b of the first flexible substrate 101 and the first surface 102a of the second flexible substrate with an adhesive layer 11 therebetween so as to form a laminated structure 50.

Figure 2B:
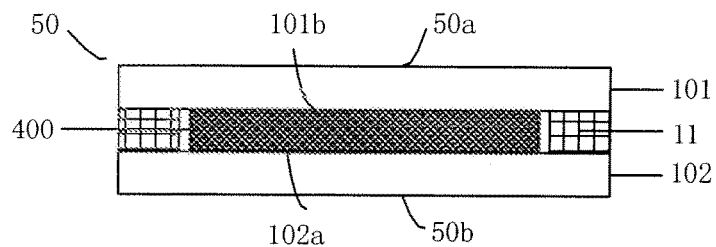

In step 2, as shown in FIG. 2b, it's also possible to provide the adhesive layer 11 only at the peripheral areas of the second surface 101b of the first flexible substrate 101 and the first surface 102a of the second flexible substrate 102 while the central area is provided with removable spacers 400, to join the first and second flexible substrates into the laminated structure 50. The spacers 400 are not in direct contact with the adhesive layer 11. The spacers 400 may be selectively in a square, circle, oval shape or other optional shapes, and the function of the spacers 400 is to separate the first and second flexible substrates from each other and support the first and second flexible substrates, so as to facilitate the film fabrication process on the flexible substrates.

In step 2, the first and second flexible substrates may be glass substrates, and the thickness thereof may be not greater than 30 μm and not less than 20 μm.

In step 2, the adhesive layer may be selected to be formed of silicane-based adhesive.

Figure 2C:
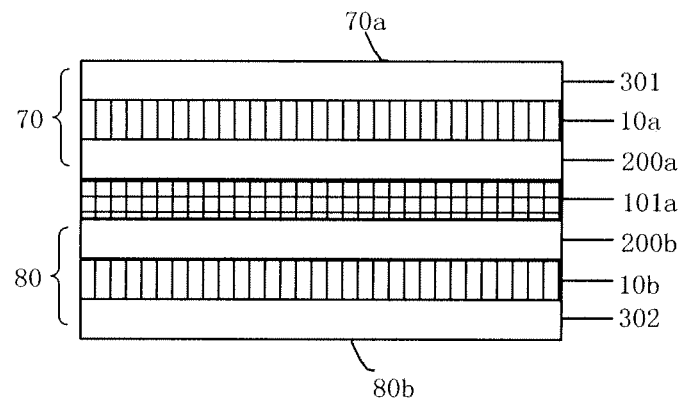
Figure 2D:
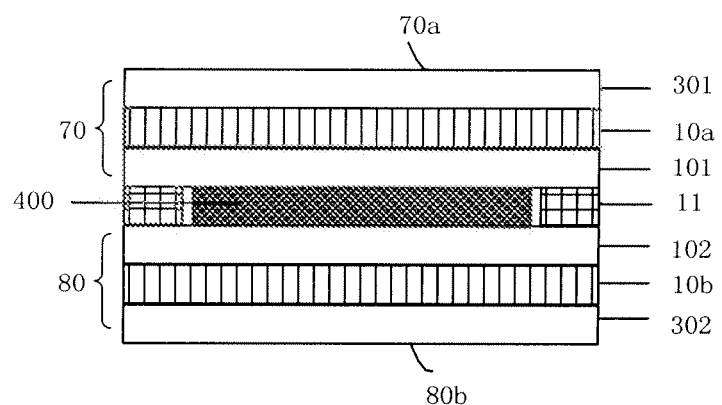

3. As shown in FIGS. 2c-2d, forming a first flexible display element layer 10a and a first opposite flexible substrate 301 in this order on the first outer surface 50a of the laminated structure 50, constituting a first flexible display device 70, and forming a second flexible display element layer 10b and a second opposite flexible substrate 302 in this order on the second outer surface 50b of the laminated structure 50, constituting a second flexible display device 80.

In step 3, the flexible display element layer may be any one of an organic light emitting layer, a liquid crystal display layer, an electrophonic display layer, an electrowetting layer, an electrochromism layer, and so on; the outer surface 70a of the first flexible display device 70 and the outer surface 80b of the second flexible display device 80 may each comprise a protective layer (not shown).

In step 3, the first flexible display device 70 and the second flexible display device 80 may also be mono-substrate devices, that is to say, do not comprise the first and second opposite flexible substrates.

4. Immersing the laminated structure into the solvent, and separating the first and second flexible display devices from each other.

In step 4, the solvent may be selected to be tetrahydrofuran solution.

In the method for manufacturing a flexible display device of this embodiment, the first and second flexible substrates are joined into a laminated structure through an adhesive layer, such that the two flexible substrates are mutually supported, thereby it's possible to conveniently perform processes in subsequent process and the production efficiency is improved.

Embodiment 3

Figure 3A:
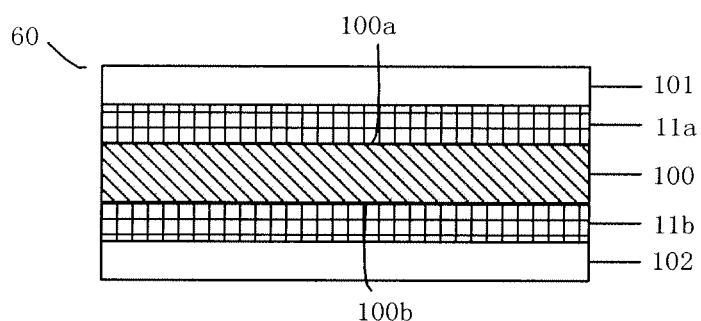
FIGS. 3a-3b a the third embodiment of the method for manufacturing a flexible display device.

The above processes belong to an specific example provided in this embodiment; and another example of this embodiment may further comprise:

Providing a support member 100 comprising a first surface and a second surface;

Accordingly, the above step 2 may be: as shown in FIG. 3a, the first surface of the support member 100 is formed with an adhesive layer 11a thereon, the second surface of the support member 100 is formed with an adhesive layer 11b; the first flexible substrate 101 is adhered to the first surface 100a of the support member 100, and the second flexible substrate 102 is adhered to the second surface 100b of the support member 100, forming a laminated structure 60.

Figure 3B:
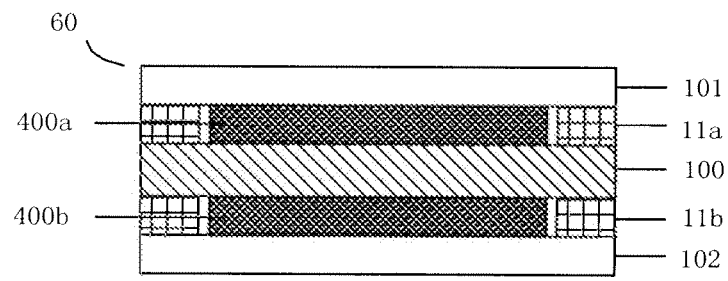

In step 2, as shown in FIG. 3b, it' also possible to form the adhesive layer 11a only at the peripheral area of the first surface 100a of the support member 100 while the central area is provided with removable spacers 400a, and to form the adhesive layer 11b at the peripheral area of the second surface 100b of the support member 100 while the central area is provided with removable spacers 400b; then the first flexible substrate 101 is adhered to the first surface 100a of the support member 100 and the second flexible substrate 102 is adhered to the second surface 100b of the 100, forming a laminated structure 60. The spacer 400a are not in direct contact with the adhesive layer 11a; and the spacer 400b are not in direct contact with the adhesive layer 11b. The spacers 400a and 400b may be selected to be in a square, circle, or oval shape or optionally in another shape, and the function thereof is to separate the first and second flexible substrates from each other and support the first and second flexible substrates, and to facilitate the film fabrication process on the flexible substrates.

In step 2, the adhesive layer may be selected to be formed of a silicane-based adhesive.

The above step 4 is to immerse the laminated structure into solvent and separate the first and second flexible display devices from the support member 100.

In step 4, the solvent may be selected to be tetrahydrofuran solution.

In the method for manufacturing a flexible display device of this embodiment, after the first and second flexible substrates are fixed to a support member through an adhesive layer located therebetween, subsequent film fabrication processes are performed, which method is suitable for the process of various flexible substrates, such as plastic substrate, metal foil, thin glass substrate and so on, and for any purpose of achieving a good effect with a support member.

Embodiment 4

In this embodiment, another implementation of the method for manufacturing a flexible display device is described in connection with the case where the connecting element is an adhesive layer, as an example.

Referring to FIGS. 4a-4d, the method for manufacturing a flexible display device provided by this embodiment may comprise the following steps.

1. Providing a first flexible substrate 101 having a first surface and a second surface, and providing a second flexible substrate 102 having a third surface and a fourth surface.

Figure 4A:
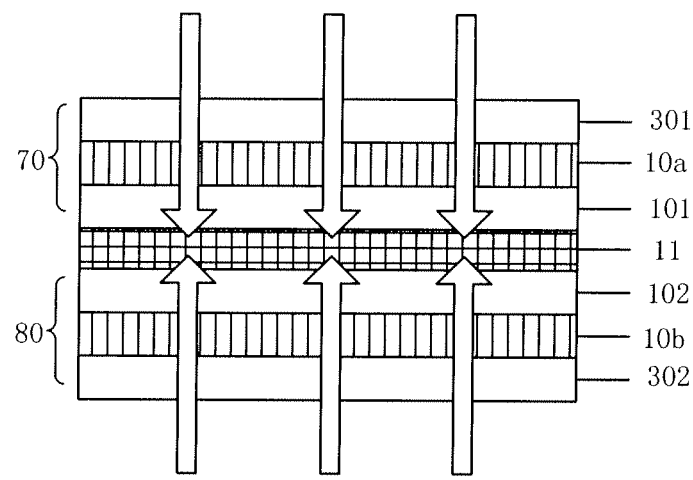
FIGS. 4a-4d a the fourth embodiment of the method for manufacturing a flexible display device.

2. As shown in FIG. 4a, providing an adhesive layer 11 between the second surface 101b of the first flexible substrate 101 and the first surface 102a of the second flexible substrate so as to form a laminated structure 50.

Figure 4B:
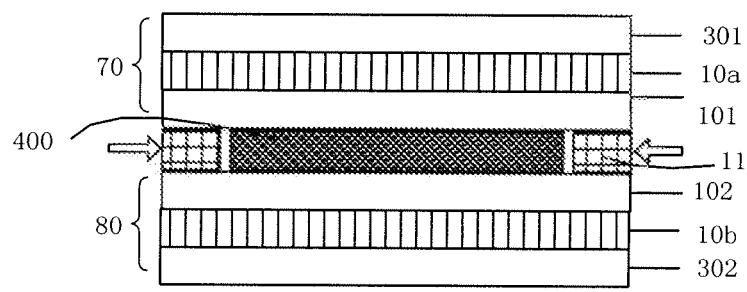

In step 2, as shown in FIG. 4b, it's also possible to provide the adhesive layer 11 only at the peripheral areas of the second surface 101b of the first flexible substrate 101 and the first surface 102a of the second flexible substrate 102 while the central area is provided with removable spacers 400, to join the first and second flexible substrates into the laminated structure 50. The spacers 400 may be selected to be in a square, circle, or oval shape or optionally in another shape, and the function thereof is to separate the first and second flexible substrates from each other and support the first and second flexible substrates, so as to facilitate the film fabrication process on the flexible substrates.

Figure 4C:
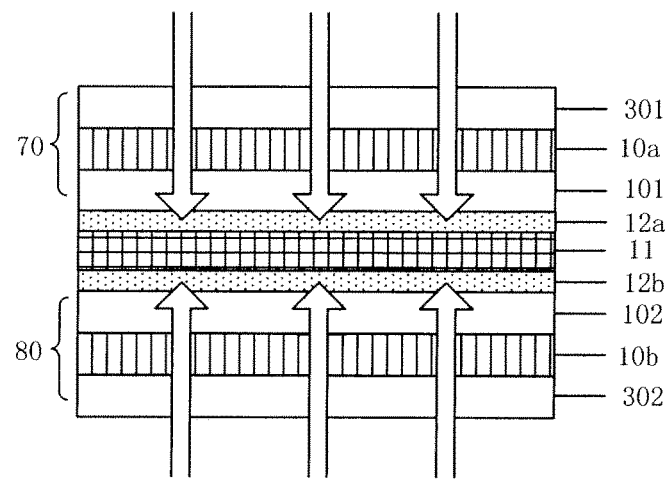

In step 2, as shown in FIG. 4c, it's also possible to, before providing the adhesive layer 11 on the second surface 101b of the first flexible substrate and the first surface 102a of the second flexible substrate, provide buffer layers 12a and 12b respectively on the second surface 101b of the first flexible substrate 101 and the first surface 102a of the second flexible substrate 102, and the buffer layers may be selected to be SiN:H or a-Si:H layers.

Figure 4D:
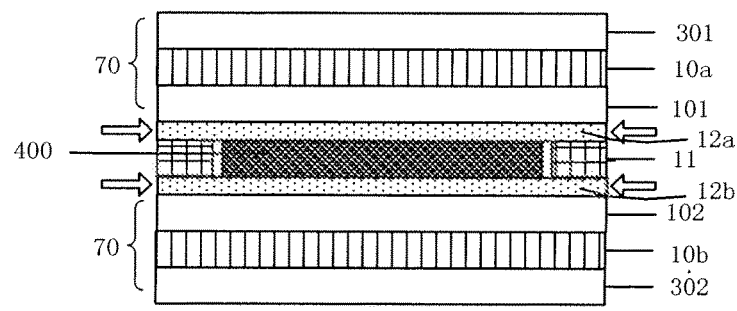

In step 2, as shown in FIG. 4d, it's also possible to, before providing the adhesive layer 11 at the peripheral areas of the second surface 101b of the first flexible substrate and the first surface 102a of the second flexible substrate, provide buffer layers 12a and 12b respectively on the second surface 101b of the first flexible substrate 101 and the first surface 102a of the second flexible substrate 102, and the buffer layers may be selected to be SiN:H or a-Si:H layers.

In step 2, the first and second flexible substrates may be selected to be glass substrates, and the thickness thereof may be not greater than 30 μm and not less than 20 μm.

In step 2, the adhesive layer may be selected to be formed of an adhesive containing a polyimide component.

3. Forming a first flexible display element layer 10a and a first opposite flexible substrate 301 in this order on the first outer surface 50a of the laminated structure 50, constituting a first flexible display device 70, and forming a second flexible display element layer 10b and a second opposite flexible substrate 302 in this order on the second outer surface 50b of the laminated structure 50, constituting a second flexible display device 80.

In step 3, the flexible display element layer may be any one of an organic light emitting layer, a liquid crystal display layer, an electrophonic display layer, an electrowetting layer, an electrochromism layer, and so on.

In step 3, the first flexible display device 70 and the second flexible display device 80 may also be mono-substrate devices, that is to say, do not comprise the first and second opposite flexible substrates.

4. Irradiating the adhesive layer 11 or the buffer layer 12 by using a laser, and separating the first flexible display device 70 and the second flexible display device 80 from each other.

In step 4, as shown in FIG. 4a, in a manner corresponding to that in step 2 for providing the adhesive layer 11 on the second surface 101b of the first flexible substrate and the first surface 102a of the second flexible substrate 102, the adhesive layer 11 is irradiated from the upper and lower surfaces of the laminated structure, the first and second flexible display devices 70 and 80 are separated from each other, and the first and second flexible display devices 70 and 80 are transparent.

In step 4, as shown in FIG. 4b, in a manner corresponding to that in step 2 for providing the adhesive layer 11 only at the peripheral areas of the second surface 101b of the first flexible substrate 101 and the first surface 102a of the second flexible substrate 102, the adhesive layer 11 is irradiated by the laser from the sides of the laminated structure, and the first and second flexible display devices 70 and 80 are separated from each other.

In step 4, as shown in FIG. 4c, in a manner corresponding to that in step 2 used to, before providing the adhesive layer 11 on the second surface 101b of the first flexible substrate 101 and the first surface 102a of the second flexible substrate 102, provide buffer layers respectively on the second surface 101b of the first flexible substrate 101 and the first surface 102a of the second flexible substrate 102, the buffer layers 12a and 12b are irradiated from the upper and lower surfaces of the laminated structure, and the first and second flexible display devices 70 and 80 are separated from each other; and the first and second flexible display devices 70 and 80 are transparent.

In step 4, as shown in FIG. 4d, in a manner corresponding to that in step 2 used to, before providing the adhesive layer 11 at the peripheral areas of the second surface 101b of the first flexible substrate 101 and the first surface 102a of the second flexible substrate 102, provide the buffer layers respectively on the second surface 101b of the first flexible substrate and the first surface 102a of the second flexible substrate 102, the buffer layers 12a and 12b are irradiated with the laser from the sides of the laminated structure, and the first and second flexible display devices 70 and 80 are separated from each other.

In the method for manufacturing a flexible display device of this embodiment, the first and second flexible substrates are joined to each other through an adhesive layer, and the first and second flexible display devices are separated from each other in a laser irradiation manner, thus it's possible to process two substrates, that is, the upper one and the lower one, during part of the processes, improving production efficiency, and at the same time, it's possible to achieve cost-cutting purpose for its simple processes and easiness to implement.

Embodiment 5

The above processes belong to an example of one specific implementation provided in this embodiment; another example of this embodiment may further comprise: providing a support member 100 comprising a first surface and a second surface.

Figure 5A:
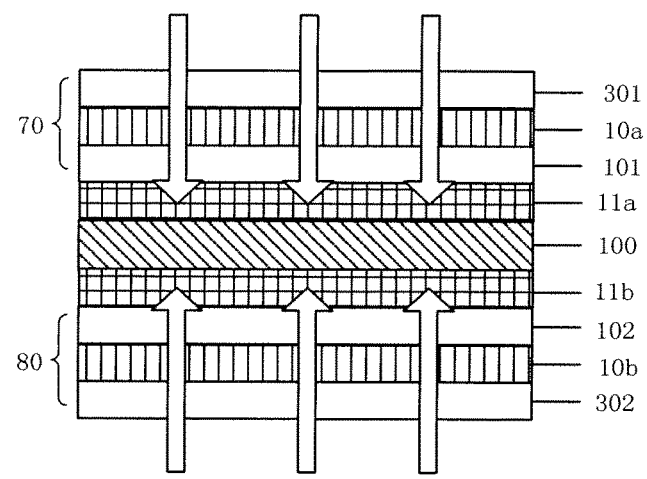
FIGS. 5a-5d a the fifth embodiment of the method for manufacturing a flexible display device.

Accordingly, the above step 2 may be that: as shown in FIG. 5a, the first surface 100a of the support member 100 is formed with an adhesive layer 11a thereon, the second surface 100b of the support member 100 is formed with an adhesive layer 11b, and the first flexible substrate 101 is adhered to the first surface 100a of the support member 100 and adhering the second flexible substrate 102 is adhered to the second surface 100b of the support member 100, then forming a laminated structure 60.

Figure 5B:
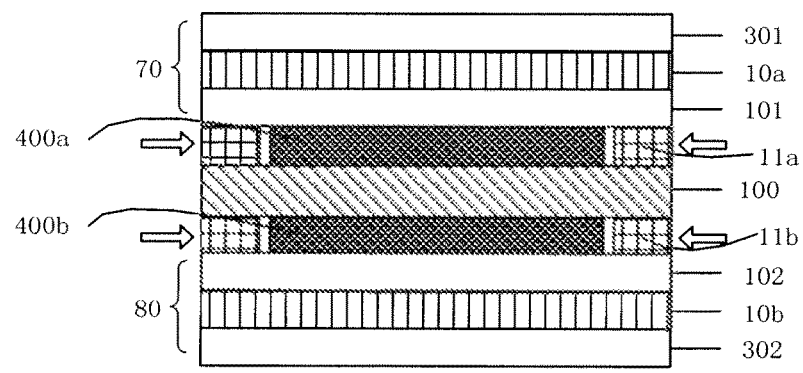

In step 2, as shown in FIG. 5b, it' also possible to form the adhesive layer 11a only at the peripheral area of the first surface 100a of the support member 100 while the central area is provided with removable spacers 400a, and to form the adhesive layer 11b at the peripheral area of the second surface 100b of the support member 100 while the central area is provided with removable spacers 400b, then the first flexible substrate 101 is adhered to the first surface 100a of the support member 100 and the second flexible substrate 102 is adhered to the second surface 100b of the 100, forming a laminated structure 60. The spacers 400a and 400b may be selected to be in a square, circle, or oval shape or optionally in another shape, and the function thereof is to separate the first and second flexible substrates from each other and support the first and second flexible substrates, to facilitate the film fabrication process on the flexible substrates.

Figure 5C:
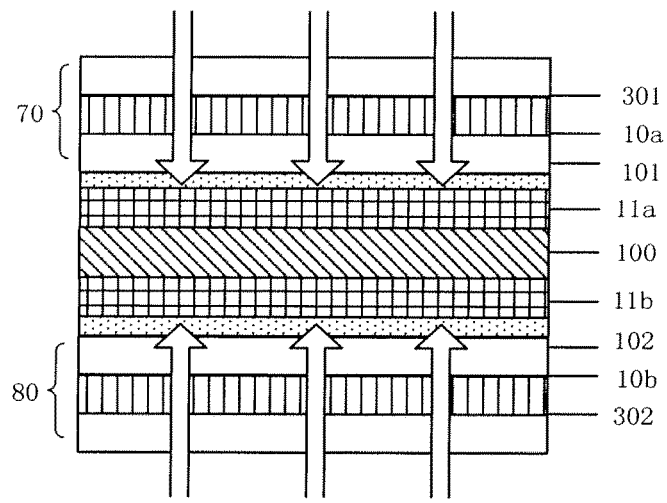

In step 2, as shown in FIG. 5c, it's also possible to, before forming the adhesive layer on the second surface and the second surface of the support member 100, providing the buffer layers 12a and 12b respectively on the second surface 101b of the first flexible substrate 101 and the first surface 102a of the second flexible substrate 102, and the buffer layers may be selected to be SiN:H or a-Si:H layers.

Figure 5D:
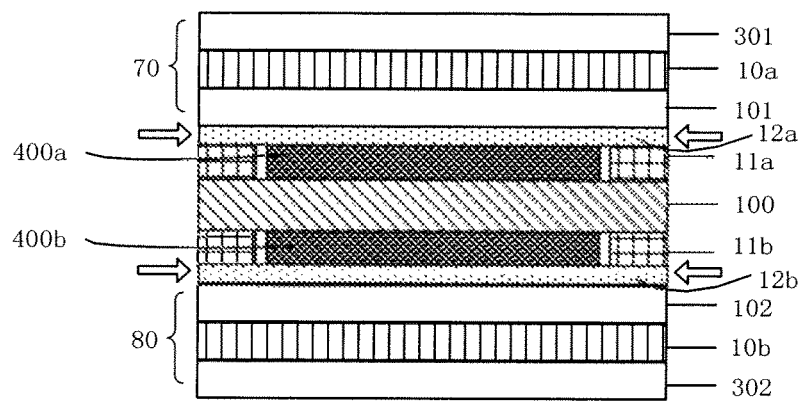

In step 2, as shown in FIG. 5d, it's also possible to, before forming the adhesive layer on the peripheral areas of second surface and the second surface of the support member 100, providing the buffer layers 12a and 12b respectively on the second surface 101b of the first flexible substrate 101 and the first surface 102a of the second flexible substrate 102, the buffer layers may be selected to be SiN:H or a-Si:H layers.

In step, the adhesive layer may be selected to be formed of an adhesive containing a polyimide component.

The above step 4 is: laser-irradiating the adhesive layers 11a and 11b or the buffer layers 12a and 12b, and separating the first flexible display device 70 and the second flexible display device 80 from the support member 100.

In step 4, as shown in FIG. 5a, in a manner corresponding to that in step 2 for forming the adhesive layer on the first surface 100a and the second surface 100b of the support member 100, the adhesive layers 11a and 11b are irradiated from the upper and lower surfaces of the laminated structure, the first and second flexible display devices 70 and 80 are separated from each other, and the first and second flexible display devices 70 and 80 are transparent.

In step 4, as shown in FIG. 5b, in a manner corresponding to that in step 2 for providing the adhesive layer only at the peripheral areas of the first surface 100a and the second surface 100b of the support member 100, the adhesive layers 11a and 11b are irradiated with the laser from the sides of the laminated structure, and the first and second flexible display devices 70 and 80 are separated from the support member 100.

In step 4, as shown in FIG. 5c, in a manner corresponding to that in step 2 used to, before forming the adhesive layer on the first surface and the second surface of the support member 100, provide buffer layers 12a and 12b respectively on the second surface 101b of the first flexible substrate 101 and the first surface 102a of the second flexible substrate 102, the buffer layers 12a and 12b are irradiated from the upper and lower surfaces of the laminated structure, the first and second flexible display devices 70 and 80 are separated from the support member 100, and the first and second flexible display devices 70 and 80 are transparent.

In step 4, as shown in FIG. 5d, in a manner corresponding to that in step 2 used to, before forming the adhesive layer at the peripheral areas of the first surface and the second surface of the support member 100, provide the buffer layers 12a and 12b respectively on the second surface 101b of the first flexible substrate 101 and the first surface 102a of the second flexible substrate 102, the buffer layers 12a and 12b are irradiated with the laser from the sides of the laminated structure, and the first and second flexible display devices 70 and 80 are separated from the support member 100.

In the method for manufacturing a flexible display device of this embodiment, the first and second flexible substrates are fixed to a support member through an adhesive layer, and the first and second flexible substrates are separated from the support member in a laser-irradiating manner, the processes are easy to be implemented while improving product yields and reducing the production costs. This method is suitable for various flexible substrates, such as a plastic substrate, a metal foil, a thin glass substrate and so on, and for the purpose to achieve a good effect.

Embodiment 6

In this embodiment, another example of the method for manufacturing a flexible display device is described in which the connecting element is an adhesive layer.

Referring to FIGS. 6a-6e, the method for manufacturing a flexible display device provided by this embodiment may specifically comprise the following steps.

1. Providing a first flexible substrate 101 having a first surface and a second surface, and providing a second flexible substrate 102 having a third surface and a fourth surface.

Figure 6A:
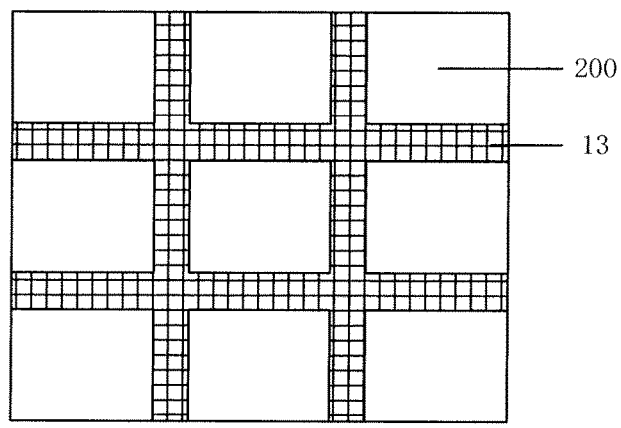
FIGS. 6a-6e a the sixth embodiment of the method for manufacturing a flexible display device.
Figure 6B:
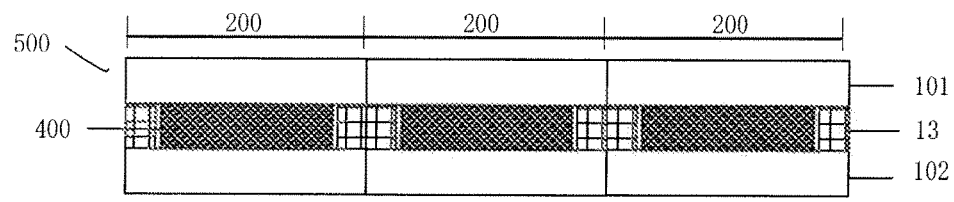

2. As shown in FIGS. 6a-6b, the first and second flexible substrates are divided into several flexible panels 200, and each of the flexible panels 200 is provided with an adhesive layer 13 at its peripheral area while the central area thereof is provided with spacers 400, and the first and second flexible substrates are adhered to form a laminated structure 500. The spacers 400 are not in direct contact with the adhesive layer 13.

In step 2, the first and second flexible substrates may be selected to be glass substrates, and the thickness thereof may be selected to be not greater than 30 μm and not less than 20 μm.

Figure 6C:
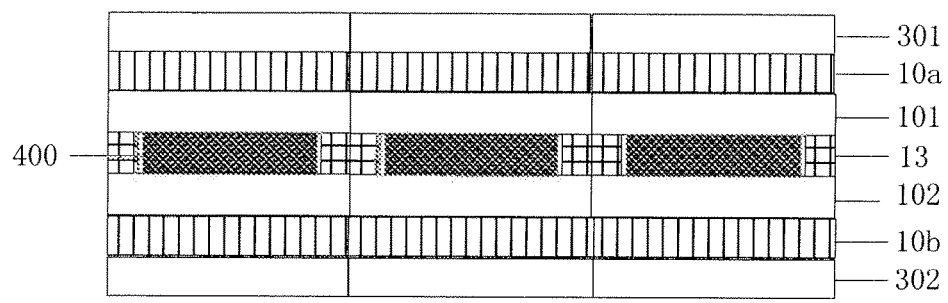

3. As shown in FIG. 6c, forming a first flexible display element layer 10a and a first opposite flexible substrate 301 in this order on the first outer surface 500a of the laminated structure 500, constituting several first flexible display device, and forming a second flexible display element layer 10b and a second opposite flexible substrate 302 in this order on the second outer surface 500b of the laminated structure 500, constituting several second flexible display device.

In step 3, the flexible display element layer may be any one of an organic light emitting layer, a liquid crystal display layer, an electrophonic display layer, an electrowetting layer, an electrochromism layer, and so on.

In step 3, the first flexible display device and the second flexible display device may also be mono-substrate devices, that is to say, do not comprise the first and second opposite flexible substrates.

Figure 6D:
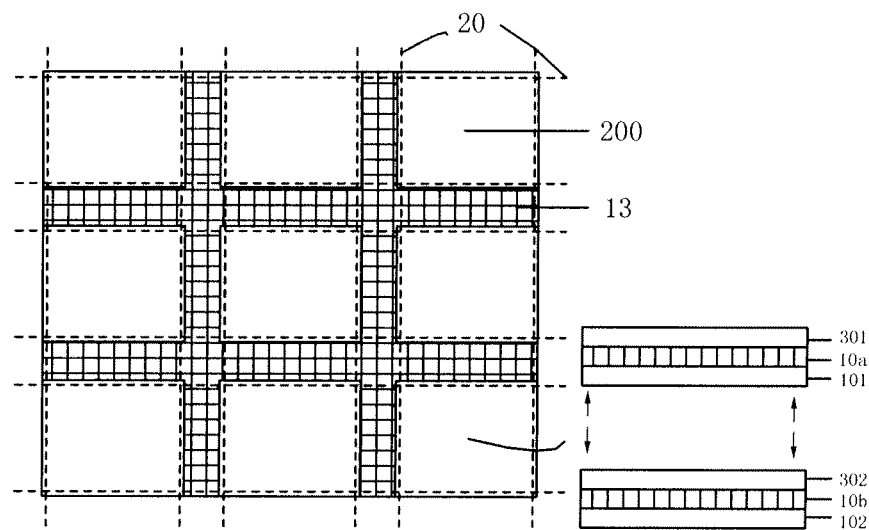

4. As shown in FIG. 6d, cutting lines 20 are provided inside the adhesive layer 13, and respective first and second flexible display devices that are opposite to each other are separated from each other by cutting.

Figure 6E:
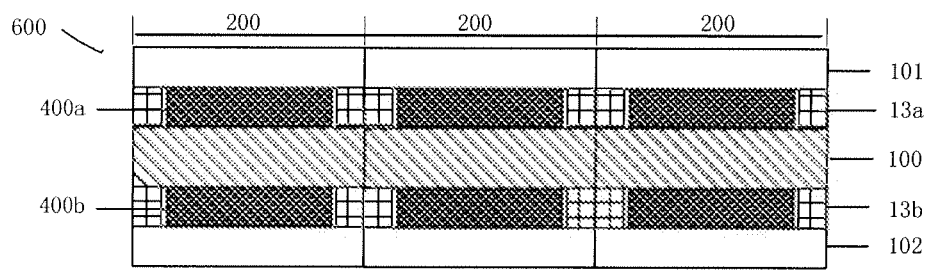

The above processes belong to an example of one specific implementation provided in this embodiment; another example of this embodiment may further comprise: providing a support member 100 comprising a first surface and a second surface;

Accordingly, the above step 2 is: as shown in FIG. 6e, the first and second flexible substrates are divided into several flexible panels, and each of the flexible panels 200 are provided with an adhesive layer 13 at its peripheral area while the central area thereof is provided with spacers 400, and the first and second flexible substrates are adhered to the first and second surfaces of the support member 100 to form a laminated structure 600. The spacers 400a are not in direct contact with the adhesive layer 13; and the spacers 400b are not in direct contact with the adhesive layer 13b.

The above step 4 is: cutting lines 20 are provided inside the adhesive layer 13, and respective first and second flexible display devices that are opposite to each other are separated from the support member 100 by cutting.

In the method for manufacturing a flexible display device of this embodiment, the first and second flexible substrates are joined into a laminated structure through an adhesive layer, and respective flexible display devices are separated from each other by cutting, thereby the processes thereof are simple and easy to implement, no damage occurs to the panels, and it's possible to manufacture several display devices simultaneously in a mass production manner and improve production efficiency. The manner of inserting a support member between two flexible substrates may widely apply to the processes of various flexible substrates and for any purpose of achieving a good effect with a support member.

Embodiment 7

In this embodiment, the method for manufacturing a flexible display device will be introduced for the case where the connecting element is a fastener as an example, which method may comprise the following steps, for example:

1. Providing a first flexible substrate having a first surface and a second surface, and providing a second flexible substrate having a third surface and a fourth surface.

2. Providing fasteners at the peripheral parts of the first and second flexible substrates to fix the first and second flexible substrates, so as to form a laminated structure.

In step 2, the first and second flexible substrates may be selected to be glass substrates, and the thickness thereof may be selected to be not greater than 30 μm and not less than 20 μm.

In step 2, the fastener may be any one of clincher, screw, notch, snap and so on.

3. forming a first flexible display element layer and a first opposite flexible substrate in this order on the first outer surface of the laminated structure, constituting the first flexible display device, and forming a second flexible display element layer and a second opposite flexible substrate in this order on the second outer surface of the laminated structure, constituting the second flexible display device.

In step 3, the flexible display element layer may be any one of an organic light emitting layer, a liquid crystal display layer, an electrophonic display layer, an electrowetting layer, an electrochromism layer, and so on.

In step 3, the first flexible display device and the second flexible display device may also be mono-substrate devices, that is to say, do not comprise the first and second opposite flexible substrates.

4. Removing the fasteners to separate the first and second flexible display devices from each other.

The above processes belong to an example of one implementation provided in this embodiment; Another example of this embodiment may further comprise: providing a support member comprising a first surface and a second surface;

Accordingly, the above step 2 is: providing fasteners at the peripheral part of the support member, and fixing the first and second flexible substrates onto the support member to form a laminated structure.

In step 2, the fastener may be any one of clincher, screw, notch, snap and so on.

The above step 4 is: removing the fasteners and separating the first and second flexible display devices from the support member.

In the method for manufacturing a flexible display device of this embodiment, the first and second flexible substrates are joined into a laminated structure by fasteners, and the first and second flexible display devices are manufactured respectively on the first and second flexible substrates and then both of them are separated from each other by removing the fasteners, thus the technology is simple and of low cost. The manner of inserting a support member between two flexible substrates may widely apply to the processes of various flexible substrates and for any purpose of achieving a good effect with a support member.

Embodiment 8

In this embodiment, the method for manufacturing a flexible display device would be introduced for the case where the connecting element is a vacuum adsorbable substrate, as an example.

Referring to FIGS. 7a-7e, the method for manufacturing a flexible display device provided by this embodiment may comprise the following steps, for example.

1. Providing a first flexible substrate 101 having a first surface and a second surface, and providing a second flexible substrate 102 having a third surface and a fourth surface.

Figure 7A:
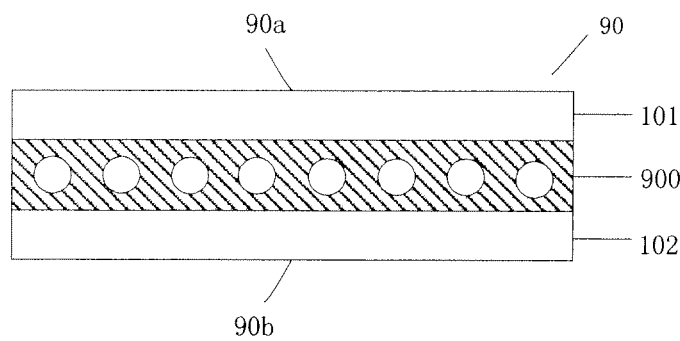
Figure 7B:
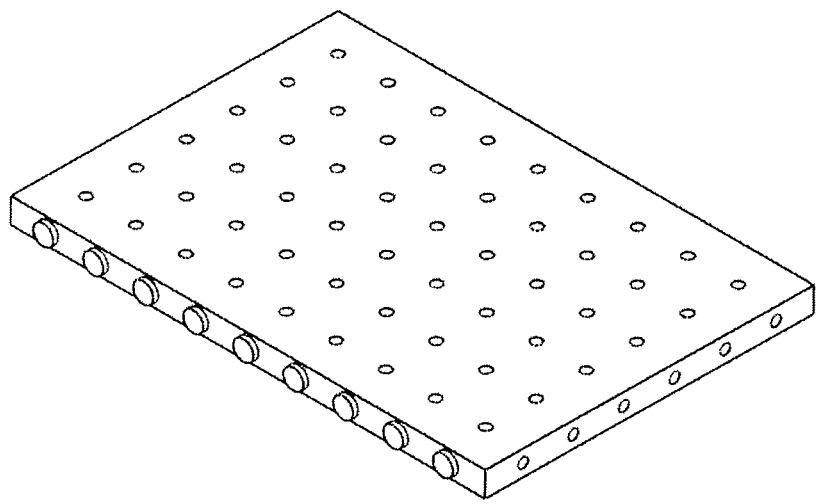
Figure 7C:
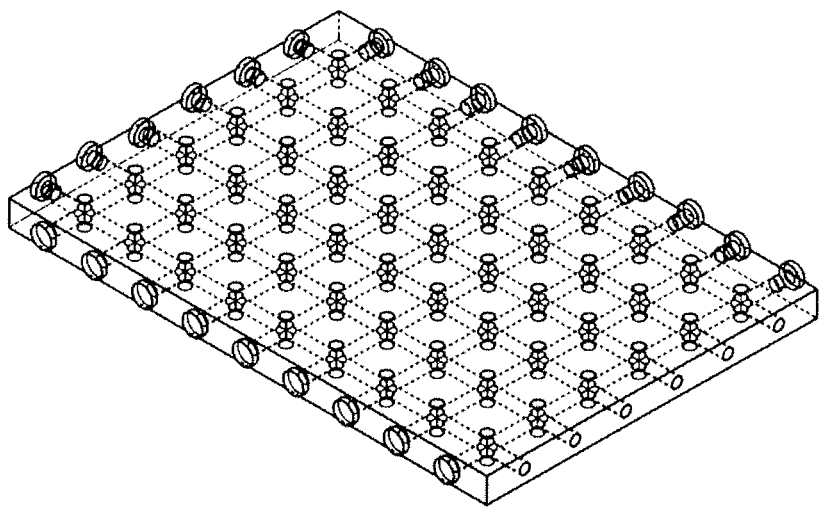
Figure 7D:
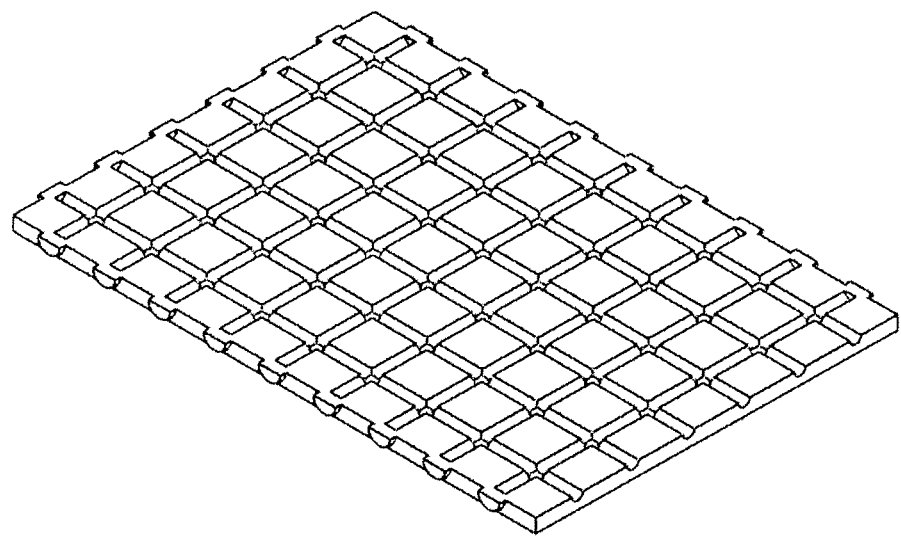
Figure 7E:
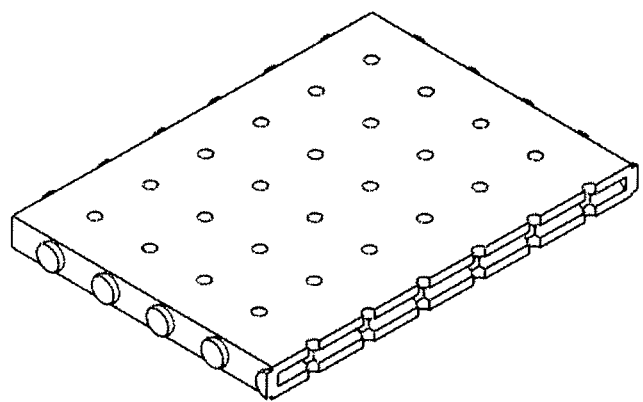

2. As shown in FIG. 7a, providing the vacuum adsorbable substrate 900 having first and second surfaces that are opposite to each other, and performing evacuating process of the vacuum adsorbable substrate to adsorb the first and second flexible substrates to the first and second surfaces of the vacuum adsorbable substrate respectively, to form a laminated structure 90;

In step 2, as shown in FIGS. 7b-7e, the vacuum adsorbable substrate 900 also has four sides adjoining with the first and second surfaces thereof, and further, an interior of the vacuum adsorbable substrate have passages communicating with each other; there are openings, running into the inner passages, distributed at the first and second surfaces and at least one side of the vacuum adsorbable substrate, wherein the opening at the at least one side is used for connecting the vacuum pumping equipment.

3. As shown in FIG. 7f, forming a first flexible display element layer 10a and a first opposite flexible substrate 301 in this order on the first outer surface 90a of the laminated structure 90, constituting a first flexible display device, and forming a second flexible display element layer 10b and a second opposite flexible substrate 302 in this order on the second outer surface 90b of the laminated structure 90, constituting a second flexible display device.

In step 3, the flexible display element layer may be any one of an organic light emitting layer, a liquid crystal display layer, an electrophonic display layer, an electrowetting layer, an electrochromism layer, and so on.

In step 3, the first flexible display device and the second flexible display device may also be mono-substrate devices, that is to say, do not comprise the first and second opposite flexible substrates.

4. Removing the vacuum pumping equipment and performing vacuum release to separate the first and second flexible display devices from the vacuum adsorbable substrate 900.

In the method for manufacturing a flexible display device of this embodiment, the first and second flexible substrates are joined together by a vacuum adsorbable substrate, thereby it's possible to perform processing simultaneously of two substrates, i.e., the upper and lower substrates, during part of the processes, improving the production efficiency, and the way for separation is simple and no damage occurs to the substrates, thus this method may apply for any such processes in which two or more substrates have to be again separated from each other after joining them.

Embodiment 9

In this embodiment, another example of the method for manufacturing a flexible display device is described in which the connecting element is an adhesive layer.

Referring to FIG. 8a, the method for manufacturing a flexible display device provided by this embodiment may comprise the following steps, for example.

1. Providing a first display device comprising a first substrate, a first flexible display element layer and a first opposite flexible substrate, providing a second display device comprising a second substrate, a second flexible display element layer and a second opposite flexible substrate, wherein the upper surface of the first opposite flexible substrate is used for the first surface of the first display device, the lower surface of the first substrate is used for the second surface of the first display device, the upper surface of the second opposite flexible substrate is used for the first surface of the second display device, and the lower surface of the second substrate is used for the second surface of the second display device.

In step 1, the flexible display element layer is any one of an organic light emitting layer, a liquid crystal display layer, an electrophonic display layer, an electrowetting layer, an electrochromism layer, and so on.

2. Joining the first surface of the first display device to the first surface of the second display device to form a laminated structure, wherein the second surface of the first display device and the second surface of the second display device are used for the first, second outer surfaces of the laminated structure, respectively.

In step 2, the connecting element may be any one of an adhesive layer, a vacuum adsorbable substrate, a fastener or other connection.

3. Performing a thinning process on the first, second outer surfaces of the laminated structure in a manner such as, chemical etching, mechanical polishing or the combination thereof, or any other manners for thinning the glass-sheets, the thickness thereof may be selected to be not greater than 30 μm.

4. Separating the first and second display devices from each other.

In the method for manufacturing a flexible display device of this embodiment, by forming the display devices firstly and then joining both of them for thinning, the problem that the common flexible display devices are difficult to be processed and the accuracy regulation thereof is unsatisfactory is solved, and further, by joining the two display devices for thinning to obtain flexibility, it's possible to perform thinning of two surfaces simultaneously, which further improves efficiency and reduces cost.

The embodiment of present invention also comprises a flexible display device comprising the flexible display device manufactured in the method for manufacturing a flexible display device of any one of the above embodiments, the flexible display device may be a cellphone, a computer, a digital camera, electronic advertising board and so on, as well as any devices to which the flexible display device can be applied.

The above described are solely exemplary embodiments of present invention, rather than limitation on the protective scope of present invention which is defined by the attached claims.

The invention claimed is:

1. A method for manufacturing flexible display device, comprising:
    providing a first flexible substrate comprising a first surface and a second surface and a second flexible substrate comprising a third surface and a fourth surface;
    joining the second surface of the first flexible substrate with the third surface of the second flexible substrate by a connecting element to form a laminated structure, wherein the first surface of the first flexible substrate is a first outer surface of the laminated structure, and the fourth surface of the second flexible substrate is a second outer surface of the laminated structure;
    forming a first flexible display element layer and a second flexible display element layer respectively on the first and second outer surfaces of the laminated structure;
    separating the first flexible substrate from the second flexible substrate of the laminated structure, and
    providing a support member comprising a first surface and a second surface opposite to each other; wherein
    joining the second surface of the first flexible substrate with the third surface of the second flexible substrate by a connecting element to form a laminated structure is that the second surface of the first flexible substrate and the third surface of the second flexible substrate are fixed to the first and second surfaces of the support member by the connecting element, respectively, so as to form the laminated structure,
    wherein, the method further comprises providing a first spacer sandwiched between the first flexible substrate and the support member, and a second spacer sandwiched between the second flexible substrate and the support member,
    wherein, the connecting element is sandwiched between the first flexible substrate and the support member and sandwiched between the second flexible substrate and the support member, and
    wherein, the first spacer and the second spacers are not in direct contact with the connecting element.

2. The manufacturing method according to claim 1, further comprising: forming a first opposite flexible substrate and a second opposite flexible substrate respectively on the first and second flexible display element layers, after forming a first flexible display element layer and a second flexible display element layer respectively on the first and second outer surfaces of the laminated structure.

3. The manufacturing method according to claim 1, wherein fixing of the second surface of the first flexible substrate and the third surface of the second flexible substrate respectively to the first and second surfaces of the support member by a connecting element comprises bonding the second surface of the first flexible substrate and the third surface of the second flexible substrate to the first and second surfaces of the support member through an adhesive layer.

4. The manufacturing method according to claim 1, wherein fixing of the second surface of the first flexible substrate and the third surface of the second flexible substrate respectively to the first and second surfaces of the support member by a connecting element comprises bonding peripheral areas of the first and second flexible substrates with peripheral areas of the first surface and the second surface of the support member through an adhesive layer.

5. The manufacturing method according to claim 4, wherein fixing of the second surface of the first flexible substrate and the third surface of the second flexible substrate respectively to the first and second surfaces of the support member by a connecting element further comprises providing spacers for supporting the flexible substrates at central areas of the first surface and the second surface of the support member, respectively, to separate the first and second flexible substrates from the support member.

6. The manufacturing method according to claim 1, wherein the first and second flexible substrates are glass substrates;
joining of the second surface of the first flexible substrate to the third surface of the second flexible substrate by a connecting element comprises: bonding the second surface of the first flexible substrate and the third surface of the second flexible substrate through an adhesive layer.

7. The manufacturing method according to claim 1, wherein the first and second flexible substrates are glass substrates;
joining of the second surface of the first flexible substrate to the third surface of the second flexible substrate by a connecting element comprises: bonding a peripheral area of the second surface of the first flexible substrate and a peripheral area of the third surface of the second flexible substrate through an adhesive layer.

8. The manufacturing method according to claim 7, wherein the joining of the second surface of the first flexible substrate and the third surface of the second flexible substrate by a connecting element further comprises: providing spacers for supporting the flexible substrates at central areas of second surface of the first flexible substrate and the third surface of the second flexible substrate, to separate the first and second flexible substrates from each other.

9. The manufacturing method according to claim 3, further comprising: forming buffer layers on the second surface of the first flexible substrate and the third surface of the second flexible substrate, before joining the second surface of the first flexible substrate and the third surface of the second flexible substrate by a connecting element.

10. The manufacturing method according to claim 1, wherein joining of the second surface of the first flexible substrate to the third surface of the second flexible substrate by a connecting element comprises: providing a vacuum adsorbable substrate comprising first and second surfaces that are opposite to each other, and performing evacuating process upon the vacuum adsorbable substrate such that the first and second flexible substrates are adsorbed to the first and second surfaces of the vacuum adsorbable substrate, respectively;
separating of the first flexible substrate from the second flexible substrate of the laminated structure comprises: releasing the vacuum inside the vacuum adsorbable substrate so as to disengage both the first flexible substrate and the second flexible substrate from the vacuum adsorbable substrate.

11. The manufacturing method according to claim 1, wherein joining of the second surface of the first flexible substrate to the third surface of the second flexible substrate by a connecting element comprises: providing fasteners at peripheral areas of the first and second flexible substrates and joining the first and second flexible substrates into a laminated structure.

12. The manufacturing method according to claim 1, wherein fixing of the second surface of the first flexible substrate and the third surface of the second flexible substrate respectively to the first and second surfaces of the support member by a connecting element comprises: providing fasteners at the peripheral areas of the first and second flexible substrates and joining the first and second flexible substrates and the support member into a laminated structure.

13. The manufacturing method according to claim 1, wherein the flexible display element layer is any one of the organic light emitting layer, the liquid crystal display layer, the electrophonic display layer, the electrowetting layer, and the electrochromism layer.

14. The manufacturing method according to claim 6, further comprising: forming buffer layers on the second surface of the first flexible substrate and the third surface of the second flexible substrate, before joining the second surface of the first flexible substrate and the third surface of the second flexible substrate by a connecting element.

15. The manufacturing method according to claim 1, wherein the first flexible substrate and the second flexible substrate are a glass substrate with a thickness of from 20 μm to 30 μm.

16. A method for manufacturing flexible display device, comprising:
providing a first display device comprising a first substrate, a first flexible display element layer and a first opposite flexible substrate;
providing a second display device comprising a second substrate, a second flexible display element layer and a second opposite flexible substrate;
joining a first surface of the first display device to a first surface of the second display device by a connecting element to form a laminated structure; wherein a second surface of the first display device and a second surface of the second display device are used for the first, second outer surfaces of the laminated structure, respectively;
wherein an upper surface of the first opposite flexible substrate is used for the first surface of the first display device, an upper surface of the second opposite flexible substrate is used for the first surface of the second display device;
thinning the first, second outer surfaces of the laminated structure; and
separating the first and second display devices from each other,
wherein joining of the first surface of the first display device to the first surface of the second display device by a connecting element further comprises: providing a first spacer and a second spacer at central areas of the first and second opposite flexible substrates to separate the first and second display devices from each other,
wherein, the method further comprises providing a support member between the first display device and the second display device, wherein, the first spacer is sandwiched between the first flexible substrate and the support member, and the second spacer is sandwiched between the second flexible substrate and the support member; and the connecting element is sandwiched between the first flexible substrate and the support member, and sandwiched between the second flexible substrate and the support member, and wherein, the first spacer and the second spacers are not in direct contact with the connecting element.

17. The manufacturing method according to claim 16, wherein joining of first surface of the first display device to the first surface of the second display device by a connecting element comprises: bonding the outer upper surface of the first opposite flexible substrate of the first display device and the outer upper surface of the second opposite flexible substrate of the second display device through an adhesive layer.

18. The manufacturing method according to claim 16, wherein joining of the first surface of the first display device to a first surface of the second display device by a connecting element comprises: bonding the peripheral area of the outer surface of the first opposite flexible substrate of the first display device and the peripheral area of the upper surface of the second opposite flexible substrate of the second display device through an adhesive layer.

19. The manufacturing method according to claim 17, wherein the laminated structure is transparent;

separating of the first and second display devices from each other comprises: irradiating the adhesive layer from the first, second outer surfaces of the laminated structure with a laser to separate the first and second display devices.

20. The manufacturing method according to claim 18, wherein separating the first and second display devices from each other comprises: irradiating the adhesive layer from the side of the laminated structure with a laser to separate the first and second display devices from each other.

21. The manufacturing method according to claim 17, wherein, before joining the first surface of the first display device to the first surface of the second display device by a connecting element to to from a laminated structure, further comprising: forming buffer layers on the upper surface of the first opposite flexible substrate and the upper surface of the second opposite flexible substrate.

22. The manufacturing method according to claim 21, wherein the laminated structure is transparent;

separating of the first and second display devices from each other comprises: irradiating the buffer layers from the first, second outer surfaces of the laminated structure with a laser to separate the first and second display devices.

23. The manufacturing method according to claim 18, wherein separating of the first and second display devices from each other comprises: providing cutting lines inside of the adhesive layer formed at the peripheral areas of the first and second opposite flexible substrates, and cutting along the cutting lines to separate the first and second display devices from each other.

24. The manufacturing method according to claim 16, wherein the flexible display element layer is any one of the organic light emitting layer, the liquid crystal display layer, the electrophonic display layer, the electrowetting layer, and the electrochromism layer.

* * * * *